United States Patent [19]
Arbeiter et al.

[11] Patent Number: 5,483,474
[45] Date of Patent: Jan. 9, 1996

[54] D-DIMENSIONAL, FRACTIONAL BANDWIDTH SIGNAL PROCESSING APPARATUS

[75] Inventors: James H. Arbeiter, Hopewell; Roger F. Bessler, Lawrenceville, both of N.J.

[73] Assignee: North Shore Laboratories, Inc., Princeton, N.J.

[21] Appl. No.: 151,965

[22] Filed: Nov. 15, 1993

[51] Int. Cl.$^6$ ................................................ G06F 15/31
[52] U.S. Cl. ..................... 364/724.01; 364/724.1
[58] Field of Search ..................... 364/724.01, 724.1, 364/724.05

[56] References Cited

U.S. PATENT DOCUMENTS

| | | | |
|---|---|---|---|
| 4,674,125 | 6/1987 | Carlson et al. | 364/724.1 |
| 4,821,223 | 4/1989 | David | 364/724.05 |
| 4,829,378 | 5/1989 | LeGall | 364/724.13 X |
| 4,918,524 | 4/1990 | Ansari et al. | 364/724.1 |
| 4,953,118 | 8/1990 | Gökler | 364/724.01 |
| 5,220,422 | 6/1993 | Oh | 364/724.01 X |
| 5,355,328 | 10/1994 | Arbeiter et al. | 364/724.1 |

OTHER PUBLICATIONS

Nussbaumer, "Pseudo QMF filter bank", IBM Tech. Discl. Bull., vol. 24, No. 6, Nov. 1981, pp. 3081–3087.

*Primary Examiner*—Tan V. Mai
*Attorney, Agent, or Firm*—George J. Seligsohn

[57] ABSTRACT

Filtering apparatus responsive to a sequence of samples of an input signal that is digitally-sampled at a given frequency, wherein the input signal defines information having at least one dimension. The apparatus includes first resampler for resampling the input-signal to derive a first signal at a first frequency which is substantially equal to the reciprocal 1/C of a given factor C times the given frequency, and second resampler for resampling the first signal to derive a second signal at a second frequency which is substantially equal to the given factor C times the first frequency. The given factor C is an improper fraction having a least-common-denominator larger than one. This filtering apparatus is particularly suitable for variably spatially low-pass, high-pass, band-pass or hierarchical-pyramid filtering two-dimensional image information in each of its two-dimensions by amounts which are independent of one another.

13 Claims, 8 Drawing Sheets

D-DIMENSIONAL, FRACTIONAL BANDWIDTH SIGNAL PROCESSING APPARATUS

BACKGROUND OF THE INVENTION

1. Field of the Invention

The present invention relates to signal processing apparatus, such as image processing apparatus, for providing variable-bandwidth filtering of a D-dimensional signal (where D may have a given value equal to or larger than one) and, more particularly, to such apparatus capable of providing a linearly variable response over a wide range of cutoff frequencies with linear phase.

2. Description of the Prior Art

It is known to apply various types of signal processing to signals to extract certain features of interest for further analysis. Usually, linear filtering is the main tool used in such applications, such as low-pass, band-pass, or high-pass filtering a signal to remove high, mid, or low frequencies respectively. Further, in many cases it is advantageous to interactively vary the cutoff of the filter to isolate features of interest, so that a variable bandwidth filter is desirable.

Typically, in one-dimensional (1D) signal enhancement, such as in enhancing horizontal frequencies in a television picture, analog or digital filters can be used. Variable-bandwidth analog filters are known in the art. However, providing a linearly variable response over a wide range of cutoff frequencies with the added desirable property of linear phase is extremely difficult and costly in the case of variable-bandwidth analog filters. Variable-bandwidth digital filters (which can be implemented by switching in a different set of filter coefficients for each new cutoff frequency) are to be preferred because they can have precisely linear phase over their entire range of operation, and they can be made completely stable under all conditions. However, one problem with such implemented variable-bandwidth digital filters is that the number of coefficients needed to represent a wide range of various cutoff frequencies can grow extremely large depending on the degree of incremental "fineness" of the variation from one cutoff frequency to another.

The use of filtering in two-dimensional (2D) image enhancement applications is known. Another problem that occurs in such 2D image enhancement applications is the need to store multiple points vertically for filtering. In raster-scanned images, where adjacent vertical points are one full scan line apart, this means storing a number of successive lines in order to access the points needed for a filtering. In analog filter implementations, at most one to two lines are possible. This is usually achieved using CCD (charge-coupled delay) delay lines, which are costly. In digital filter implementations, the storage is achieved with digital memories, which are less expensive and more robust than CCD delay lines.

It is known in signal theory that a filters' bandwidth is inversely related to its time response. That is, as the passband is made more narrow the corresponding time response of the filter gets longer. In the case of vertical filtering, low frequencies can only be extracted by using many lines of storage. This can be very expensive. The cost and complexity of doing this with analog filters would be prohibitive.

A known technique (disclosed in U.S. Pat. No. 4,674,125) for solving such vertical-filtering imaging problems is to use Laplacian pyramidal processing. In Laplacian pyramidal processing, a signal is decomposed in multiple, octave-wide, spatial-frequency bands; wherein the frequency decomposition inherently produces bands of information containing one octave of frequency, where adjacent bands touch on octave boundaries. This approach relies on repetitive usage of low-pass filter-subsample operations, so that the means for high-order low-frequency filtering is accomplished very efficiently and cost-effectively.

A problem with octave decomposition that occurs in known Laplacian pyramidal processing results from integer subsampling by two at each level of the pyramid. This imposes a severe limitation on the processing of some signals. For optimal spectral decomposition, it is desirable to produce band-pass (or low-pass) components that are not octave wide to better match the information of interest. For example, in image transmission a technique called progressive transmission is sometimes used. The signal is first put into a Laplacian pyramid format, and the lower-resolution images are transmitted quickly due to their relatively low quantity of data. As bandwidth permits, refinements of the image (the higher frequency band-pass components) are sent and added in at the receiver to reconstruct the original image. This process assures that the receiver always displays a full image, although initially a blurred version of the original is displayed which becomes clearer if and when later-received higher frequency band-pass components are added to the display.

Using the Laplacian pyramid to process a 2-D image means that the amount of data in each band increases from band-to-band by a factor of four (two per dimension.) In moving up to the higher resolution bands, the increase in data by four may be too much for the channel to handle, while for instance, an increase in two might not. Thus, there is a great advantage in scaling the quantity of data as needed, and not be limited to the fixed octave-width sizes of the spatial-frequency bands forced by the aforesaid known Laplacian pyramid technique.

Further, reference is made to our copending U.S. patent application Ser. No. 08/033,503, filed Mar. 18, 1993, entitled "Resampling Apparatus Suitable for Resizing a Video Image", which is assigned to the same assignee as the present application, the disclosure of which is incorporated herein by reference.

SUMMARY OF THE INVENTION

The present invention is directed to improved digital-filter apparatus that incorporates principles disclosed in the aforesaid U.S. patent application Ser. No. 08/033,503, (U.S. Pat. No. 5,355,328) which makes it possible to achieve a controllably variable-bandwidth for the digital filter.

More specifically, the present invention is directed to an improvement in filtering apparatus responsive to a sequence of samples of an input signal that is digitally-sampled at a given frequency, wherein the input signal defines information having at least one dimension. The apparatus comprises first means for resampling the input-signal to derive a first signal at a first frequency which is substantially equal to the reciprocal 1/C of a given factor C times the given frequency, and second means for resampling the first signal to derive a second signal at a second frequency which is substantially equal to the given factor C times the first frequency. In accordance with the improvement, the given factor C is an improper fraction having a least-common-denominator larger than one.

DESCRIPTION OF THE PREFERRED EMBODIMENTS

The Ser. No. 08/033,503 application discloses an input-sample frame memory for storing an input stream of digital-signal sample values written into thereto that define a 2-dimensional input video image, such as a television frame; an X,Y resampler responsive to a stream of digital-signal sample values read out from the input-sample frame memory applied thereto; and an output-sample frame memory for storing a resampled stream of digital-signal sample values written into thereto from the X,Y resampler. The samples applied to X,Y resampler spatially define a given pixel sampling period in the X (horizontal) direction of the video image and a given scanline sampling period in the Y (vertical) direction of the video image. X,Y resampler operates to alter the pixel sampling period in the X-direction in accordance with an adjustable X resample ratio applied thereto and the scanline sampling period in the Y-direction in accordance with an adjustable Y resample ratio applied thereto. This results in reducing or expanding the the size of the video image in the X-direction in accordance with the X resample ratio and independently reducing or expanding the the size of the video image in the Y-direction in accordance with the Y resample ratio.

Figure 1:
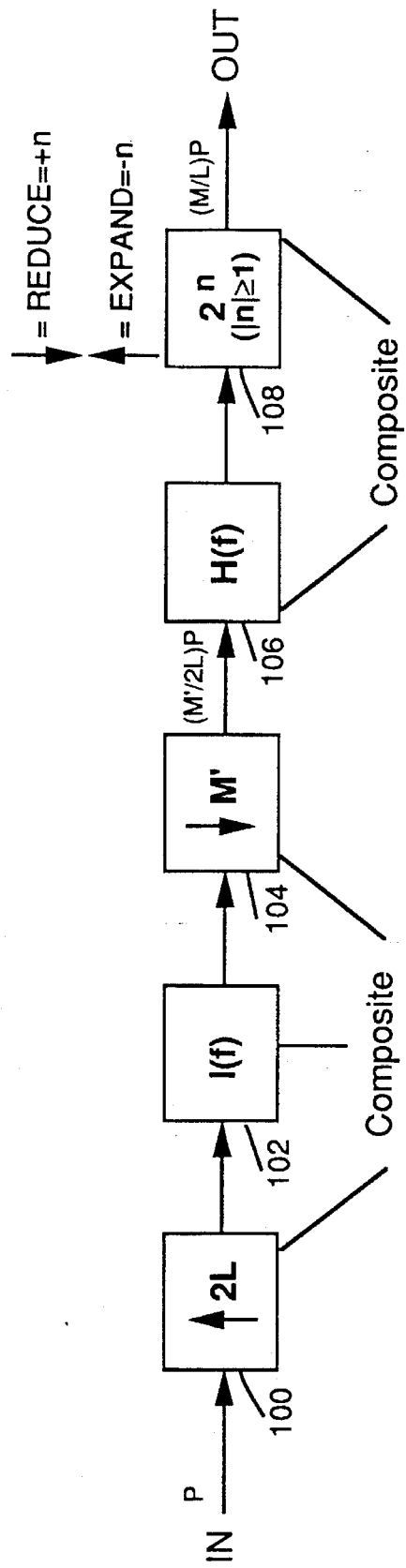
FIG. 1 is a functional block diagram illustrating a first embodiment of means for resampling the sampling period P of an input stream of digital-signal sample values that define a given dimension of information, where the given dimension may be either the horizontal or, alternatively, the vertical dimension of a video image.
Figure 3:
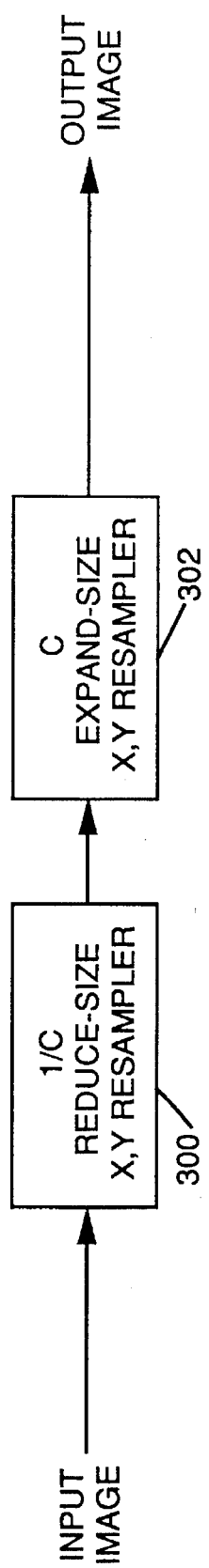
FIG. 3 is a block diagram of a low-pass filter, having frequency characteristics depicted in FIGS. 3a and 3b, that constitutes a first embodiment of the present invention.

FIG. 1 (which conforms to FIG. 3 of the Ser. No. 08/033,503 application) is a functional block diagram illustrating the approach employed by a first embodiment of the X,Y resampler that alters the input sampling period P is by a factor equal to M/L, where M/L may be either a proper fraction (M being a positive integer smaller than a positive integer L) for expansion in the X or Y size of an image or an improper fraction (M being larger than L) for reduction in the X or Y size of an image.

As indicated by block 100, interpolator I(f) 102 and block 104 (which, as indicated in FIG. 1, may be implemented, in practice, in composite form), the input is effectively upsampled by the factor 2L with interpolated digital sample values and directly downsampled by the factor M', thereby to produce a first derived sample stream having a period equal to (M'/2L)P. M' is an integer having a value smaller than that of 2L (so that M'/2L is always a proper fraction), in which the value of M' is chosen so that the value of either $2^n(M'/CL)$ or $2^{-n}(M'/CL)$ is equal to the value of M/L.

The input may be first upsampled by the factor 2L by inserting (2L−1) zero-valued samples between each pair of consecutive input sample values (as indicated by block 100) prior to appropriately interpolated values of that pair of consecutive input sample values being substituted for each of the (2L−1) zero-valued samples (as indicated by block 102), and then be downsampled by the factor M' (as indicated by block 104). However, unless the value of the proper fraction M'/2L happens to be a very small fraction, this is an inefficient approach to deriving the factor M'/2L. Specifically, because the downsampling in FIG. 1 is direct (i.e., no prefiltering is required prior to downsampling by the factor M in the X,Y resampler approach of the present invention shown in FIG. 1), makes it possible to divide a longer period interval, that is equal in length to M times the input period P, into a series of oversampled periods equal in length to ½L of this longer period and then insert appropriately interpolated values for each oversampled period of this series.

For instance, assume that M=5 and L=4, so that M/L=5/4. Therefore, in this case, M'/2L=5/8. Assume further that six successive samples of the input sample stream, occurring with a sample period P have the respective sample values $v_1$, $v_2$, $v_3$, $v_4$, $v_5$ and $v_6$. In this case, the respective upsampled interpolated sample values, occurring with a sample period 5P/8 (assuming linear interpolation), are $v_1$, $v_1+5/8(v_2-v_1)$, $v_2+1/4$ $(v_3-v_2)$, $v_2+7/8(v_3-v_2)$, $v_3+1/2(v_4-v_3)$, $v_4+1/8(v_5-v_4)$, $v_4+3/4(v_5-v_4)$, $v_5+3/8(v_6-v_5)$ and $v_6$. Thus, this process converts each group of six successive samples of the input sample stream into a group of nine successive interpolated-value samples, which occur serially at the same single clock rate as the group of six successive samples, in accordance with the aforesaid illustrative assumption. However, it should be understood that, in practice, the interpolation function need not be linear.

In FIG. 1, the first derived stream of sample values, which have a sample period equal to (M'/2L)P, are prefiltered by digital octave filter H(f) 106 and multiplied by $2^n$ means 108, where n has an absolute value of at least one, thereby producing as an output a second derived stream of sample values having a period equal to (M/L)P. As indicated in FIG. 1, the separate functions performed by digital octave filter H(f) 106 and $2^n$ means 108, in practice, may be combined in a single composite structure. Further, as indicated by the arrows situated above $2^n$ means 108, $2^n$ means 108 performs the function (1) of decreasing (downsampling) the number of samples in the second derived stream of sample values in the case of reduction in the size of an image when n has a positive value, thereby causing the sample period to be increased, and (2) of increasing (upsampling) the number of samples in the second derived stream of sample values in the case of expansion in the size of an image when n has a negative value, thereby causing the sample period to be decreased.

As discussed above, in the first embodiment shown in FIG. 1 the resampling ratio M/L may be either a proper fraction (in the expansion of the size of an image) or may be an improper fraction (in the reduction of the size of an image). Further, in the case of image expansion (M<L), in which the insertion of interpolation coefficients involves oversampling, no problem of aliasing exists. Therefore, it is not necessary to upsample by the factor 2L with interpolated digital sample values before directly downsample by the factor M', as described above in connection with FIG. 1.

The fact is that upsampling by the factor 2L doubles the number of interpolated pixel values that need to be computed and inserted into the data stream during each scanline period, which number may be quite large when the image size defined by a small portion of each successive scanline is expanded to the size of each entire successive scanline. In the case of real-time processing, this creates a practical problem in implementation. One obvious solution is to employ a system clock at twice the frequency so that all required computations can be made within the time span of each successive scanline period. However, this causes additional heating of the circuitry, which is particularly undesirable in a VLSI implementation. Another obvious solution is to employ additional computer elements operating in parallel. However, this increases the cost of implementation.

Figure 2:
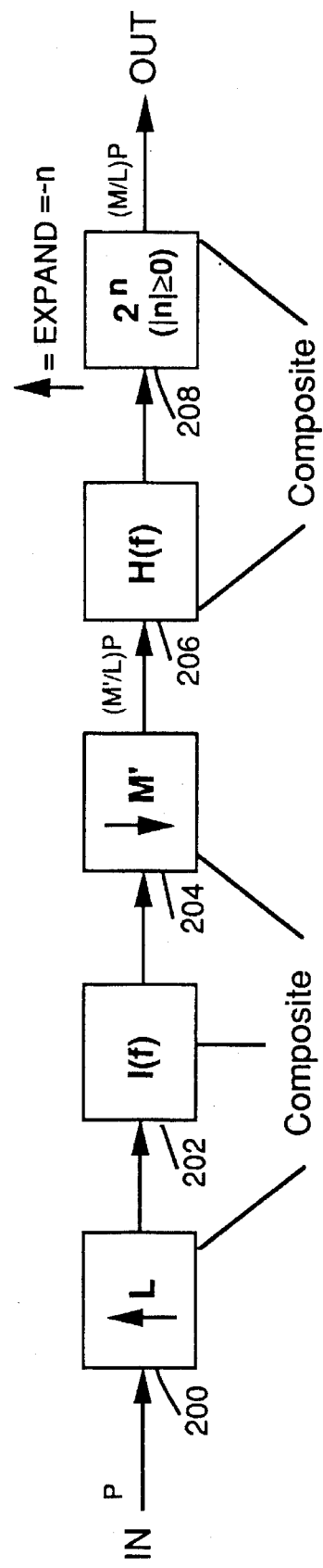
FIG. 2 is a functional block diagram illustrating a second embodiment of means for resampling the sampling period P of an input stream of digital-signal sample values that define a given dimension of information, where the given dimension may be either the horizontal or, alternatively, the vertical dimension of a video image.
Figure 3A:
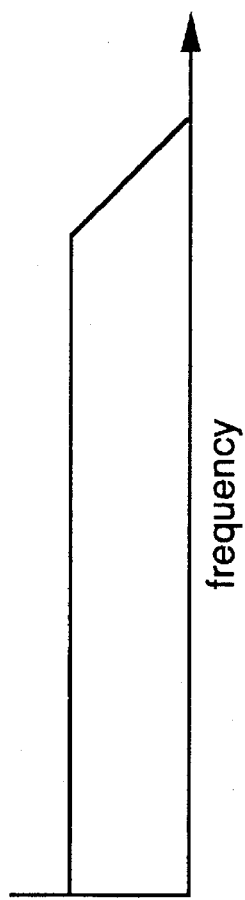

Because upsampling by the factor 2L is not required for image size expansion (but only for image size reduction), doubling the number of interpolated pixel values that need to be computed and inserted into the data stream during each scanline period and the real-time processing problem in implementation created thereby is avoided in the expansion case by only upsampling by a factor of L, rather than by a factor of 2L. FIG. 2 (which conforms to FIG. 3a of the Ser. No. 08/033,503 application) is a functional block diagram illustrating the approach employed by a second embodiment of the X,Y resampler that is limited to the expansion case in which M<L.

As indicated in FIG. 2 by block 200, interpolator I(f) 202 and block 204 (which, as indicated in FIG. 2 may be implemented, in practice, in composite form), the input is effectively upsampled by the factor L with interpolated digital sample values and directly downsampled by the factor M', thereby to produce a first derived sample stream having a period equal to (M'/L)P. M' is an integer having a value smaller than that of L (so that M'/L is always a proper fraction), in which the value of M' is chosen so that the value of $2^{-n}$(M'/L) is equal to the value of M/L.

More specifically, in FIG. 2, the first derived stream of sample values, which have a sample period equal to (M'/L)P, are prefiltered by digital octave filter H(f) 206 and multiplied by $2^{-n}$ means 208, where n has an absolute value of at least zero, thereby producing as an output a second derived stream of sample values having a period equal to (M/L)P. As indicated in FIG. 2, the separate functions performed by digital octave filter H(f) 206 and $2^n$ means 208, in practice, may be combined in a single composite structure. Further, as indicated by the arrow situated above $2^n$ means 208, $2^n$ means 208 performs the function of only increasing (upsampling) the number of samples in the second derived stream of sample values because means 208 is used only in the case of expansion in the size of an image. In this case n always has a negative value.

As known, a digital octave filter is a symmetrical multitap filter having a low-pass kernel weighting function characteristic defined by the respective multiplier coefficient values thereof. In principle, the number of taps of the symmetrical multitap filter may be either odd or even. However, in practice, it is preferred that the multitap filter have an odd number of taps so that the respective multiplier coefficient values can be symmetrically disposed about a central multiplier coefficient value of the kernel weighting function. It is usual for the value of each multiplier coefficient of a low-pass kernel weighting function to become smaller in accordance with the distance of that multiplier coefficient from the central multiplier coefficient.

For illustrative purposes, assume that in FIGS. 1 and 2 the symmetrical multitap filter is a 5-tap digital filter having a low-pass kernel weighting function characteristic defined by the five multiplier coefficient values c, b, a, b and c. Generally, in both FIGS. 1 and 2, these multiplier coefficient values meet both of the two above-described constraints. One filter that meets these two constraints has coefficients a,b,c that satisfy unity gain at DC or zero frequency, that is a+2b+2c=1, and a+2c=2b. One case of this, by way of example, would be c=1/16, b=1/4 and a=3/8. However, in the special case in which the second embodiment of FIG. 2 is employed to provide an expansion greater than 1 but less than 2 (i.e., ½<M/L<1), so that the n value of $2^n$ means 208 is zero (i.e., no upsampling is required) the five multiplier coefficient values c, b, a, b and c have the respective values 0, 0, 1, 0 and 0.

The Ser. No. 08/033,503 application discloses a 5-tap digital octave filter that requires only two one-pixel delay means in the X-direction or, alternatively, two scanline delay means regardless of the value of n. This 5-tap digital octave filter may be implemented on a VLSI chip. Further, an increase in the number of taps of the digital octave filter requires only a small increase in the number of delay means (three delay means for a 7-tap digital octave filter, four delay means for a 9-tap digital octave filter, etc.).

A purpose of the present invention is not to resize a video image. On the contrary, it is to spatially filter a video image without altering the size of the video image. Specifically, the implementation of the present invention makes use of at least one pair of X,Y resamplers in which a first of each pair is used to independently reduce the size of one or both of the dimensions of the video image by a certain X and/or Y ratio factor and a second of each pair is used to expand the size of the aforesaid one or both of the dimensions of the video image by the same certain factor. Therefore, one feature of the overall result is that the size of the image at the output of the second of each pair of X,Y resamplers remains the same as the size of the image at the input of the first of each pair of X,Y resamplers. However, another feature of the overall result is that the spatial cutoff frequency in each dimension of the image at the output of the second of each pair of X,Y resamplers is lower than the spatial cutoff frequency in each dimension of the image at the input of the first of each pair of X,Y resamplers by an amount determined by the value of the certain ratio factor in each dimension of the image.

More particularly, reduction in the X size of an original image by the first of the pair of X,Y resamplers causes there to be fewer pixel samples in each scanline of the resampled reduced image than the number of pixel samples in each scanline of the original image. Similarly, reduction in the Y size of the original image by the first of the pair of X,Y resamplers causes there to be fewer scanlines of pixel samples in the resampled reduced image than the number of scanlines of pixel samples in the original image. Thus, in the case of image size reduction, the first of the pair of X,Y resamplers between its input and output performs of a sample-decreasing function. This sample-decreasing function causes a permanent loss of the higher-frequency information defined by the omitted samples of the original image, leaving only lower-frequency information remaining. Thus, while the expansion in the X size of the reduced-sized image by the second of the pair of X,Y resamplers causes there to be the same number of pixel samples in each scanline of the resampled expanded image as the number of pixel samples in each scanline of the original image and the expansion in the Y size of the reduced-sized image causes there to be more scanlines of pixel samples in the resampled expanded image than the number of scanlines of pixel samples in the original image, such expansion in number of samples, which is derived by interpolation of the respective sample values of the reduced-sized image samples, which results in oversampling the remaining lower-frequency information, is not able to restore the higher-frequency information defined by the omitted samples of the original image.

Referring now to FIG. 3, there is shown a low-pass filter that constitutes a first embodiment of the present invention. Specifically, FIG. 3 shows 1/C reduce-size X,Y resampler 300 and C expand-size X,Y resampler 302. A stream of digital sample values defining an input image having a given pixel period $P_x$ in the X-direction and a given scanline period $P_y$ in the Y-direction is applied to the input of resampler 300. Resampler 300 includes first means for decreasing the number of pixels in each scanline of the input image by a factor 1/x while increasing their original pixel period $P_x$ of the pixels in each scanline by an improper fraction $M_{Rx}/L_{Rx}$ and second means for independently decreasing the number of scanlines of the input image by a factor 1/y while increasing their original scanline period $P_y$ of the scanlines by an improper fraction $M_{Ry}/L_{Ry}$, where the structure of each of the first and second means may take the form shown in FIG. 1 (with n having the positive value +n). Therefore, the total number of pixels in the reduced-size output image from resampler 300 is equal to 1/C of the total number of pixels in the input image to resampler 300, where 1/C is equal to the product of 1/x times 1/y.

Figure 3B:
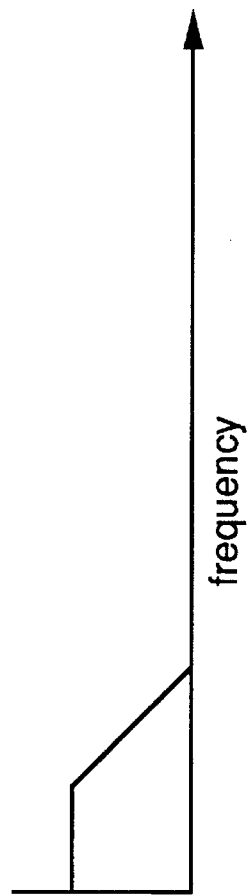

The reduced-size output image from resampler 300 is applied as an input to resampler 302. Resampler 302 includes third means for increasing the number of pixels in each scanline of the image input thereto by a factor x while decreasing their original pixel period $M_{Rx}/L_{Rx}*P_x$ of the pixels in each scanline by a proper fraction $M_{Ex}/L_{Ex}$ and second means for independently increasing the number of scanlines of the image input thereto by a factor 1/y while decreasing their original scanline period $M_{Ry}/L_{Ry}*P_y$ of the scanlines by a proper fraction $M_{Ey}/L_{Ey}$, where the structure of each of the first and second means may take either the form shown in FIG. 1 (with n having the negative value −n) or the form shown in FIG. 2 (with the form shown in FIG. 2 being preferable). The proper fractions $M_{Ex}/L_{Ex}$ and $M_{Ey}/L_{Ey}$, respectively, are substantially reciprocals of the improper fractions $M_{Rx}/L_{Rx}$ and $M_{Ry}/L_{Ry}$. Thus, the size of the output image front resampler 302 is substantially the same as the size of the input image to resampler 300. However, for the reasons discussed above, the output-image spatial spectra from resampler 302, shown in FIG. 3b, comprises only the lower-frequency information of the input-image spatial spectra to resampler 300, shown in FIG. 3a. Therefore, the pair of resamplers 300 and 302 operate as a low-pass filter. A low-pass filter comprising such a pair of serially connected 1/C reduce-size and C expand-size X,Y resamplers has a cutoff frequency which is substantially proportional to the value of the factor C.

It is old in the resampling art, after reducing the size of an input image by a factor 1/C, to then expand its size by a factor C, where the factor C is an integer. Therefore, while resamplers 300 and 302 will operate as a low-pass filter regardless of whether C is an improper fraction having a lowest-common-denominator equal to one (i.e., C is an integer) or is an improper fraction having a lowest-common-denominator larger than one (i.e., C is a non-integer), the present invention is limited to the case in which C is a non-integral improper fraction.

Figure 4:
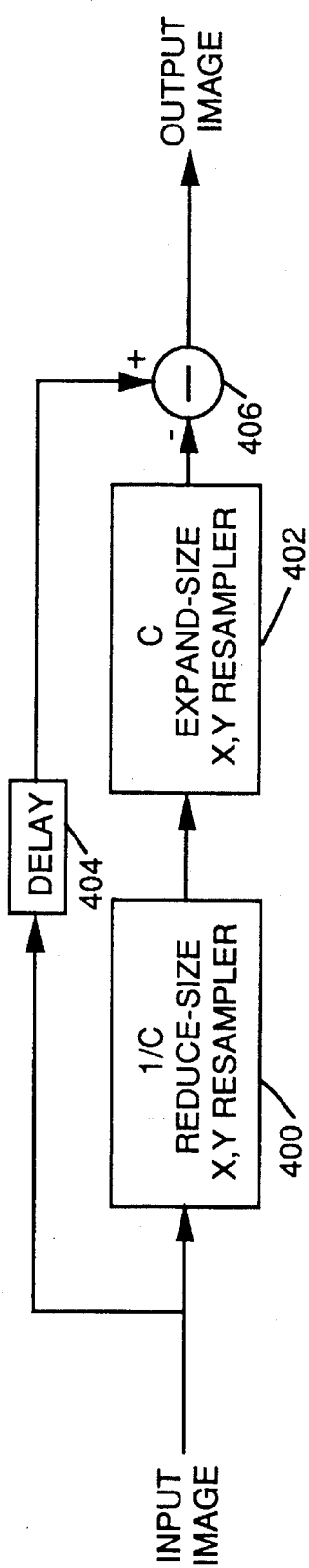
FIG. 4 is a block diagram of a high-pass filter, having frequency characteristics depicted in FIGS. 4a and 4b, that constitutes a second embodiment of the present invention.
Figure 4A:
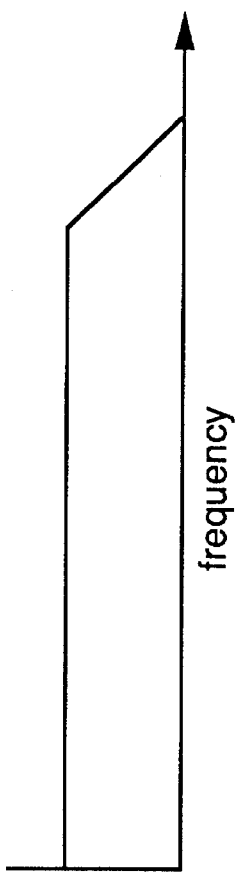
Figure 4B:
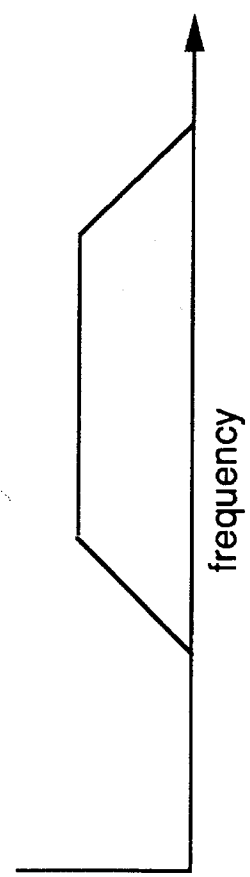

Referring now to FIG. 4, there is shown a high-pass filter that constitutes a second embodiment of the present invention. Specifically, FIG. 4 shows 1/C reduce-size X,Y resampler 400, C expand-size X,Y resampler 402, delay means 404 and subtraction means 406. Serially connected resamplers 400 and 402, which correspond in structure and function to resamplers 300 and 302 of FIG. 3, operate in the manner described above to low-pass filter the spatial spectra of the digitally-sampled input image applied as an input to resampler 400. Also, the digital samples of the input image, after being delayed by delay means 404, are applied as a minuend to the plus (+) input of subtraction means 406. The output digital samples from resampler 402 are applied as a subtrahend to the minus (−) input of subtraction means 406. The sample delay provided by delay means 404 is equal to the sample delay inserted by resamplers 400 and 402. Therefore, corresponding minuend and subtrahend samples are applied isochronously to each of the inputs of subtraction means 406, so that each sample at the output of subtraction means 406 has a value equal to the difference in the respective values of the corresponding minuend and subtrahend samples. Thus, the high-pass spatial spectra of the output image from subtraction means 406, shown in FIG. 4b, is achieved by subtracting the low-pass spatial spectra of the output from resampler 402 from the input-image spatial spectra, shown in FIG. 4a.

Figure 5:
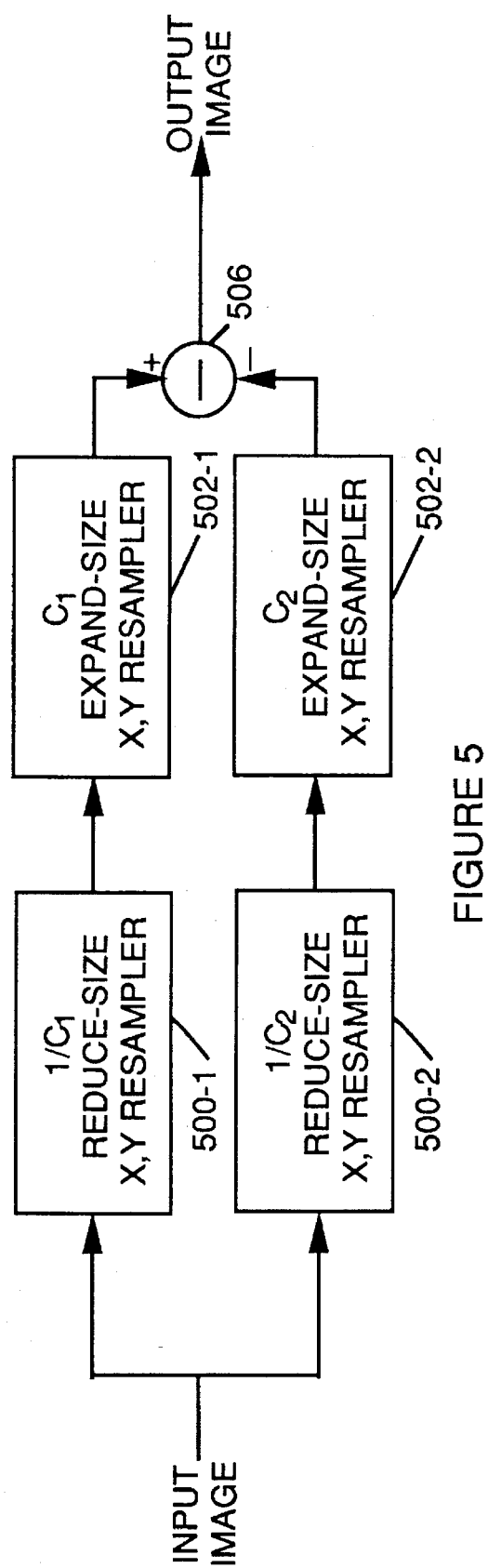
FIG. 5 is a block diagram of a band-pass filter, having frequency characteristics depicted in FIGS. 5a–5d, that constitutes a third embodiment of the present invention.

Referring now to FIG. 5, there is shown a band-pass filter that constitutes a third embodiment of the present invention. Specifically, FIG. 5 shows a first pair of serially connected resamplers comprising $1/C_1$ reduce-size X,Y resampler 500-1 and $C_1$ expand-size X,Y resampler 502-1, a second pair of serially connected resamplers comprising $1/C_2$ reduce-size X,Y resampler 500-2 and $C_2$ expand-size X,Y resampler 502-2, and subtraction means 506. Each of first pair of serially connected resamplers 500-1 and 502-1 and second pair of serially connected resamplers 500-2 and 502-2, which correspond in structure and function to resamplers 300 and 302 of FIG. 3, operate in the manner described above to low-pass filter the spatial spectra of the digitally-sampled input image applied as an input to each of resamplers 500-1 and 500-2. The digital samples of the output from resampler 502-1 are applied as a minuend to the plus (+) input of subtraction means 506 and the output digital samples from resampler 502-2 are applied as a subtrahend to the minus (−) input of subtraction means 506. Each sample at the output of subtraction means 506 has a value equal to the difference in the respective values of the corresponding minuend and subtrahend samples.

Figure 5A:
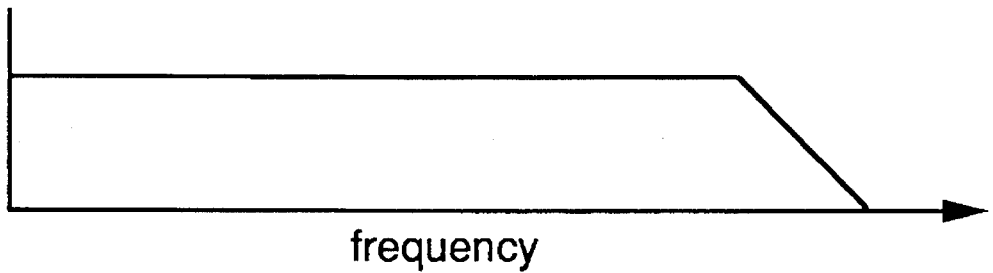
Figure 5B:
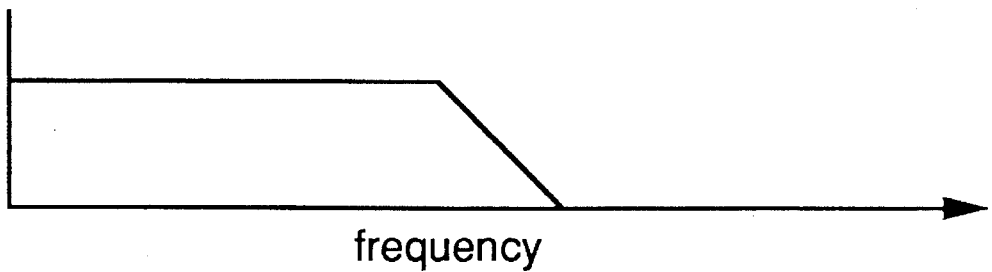
Figure 5C:
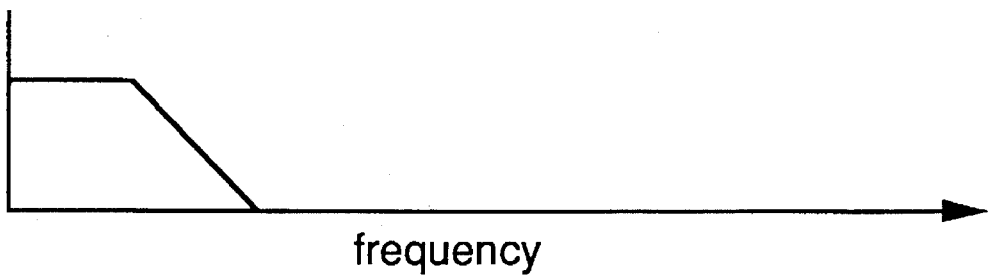
Figure 5D:
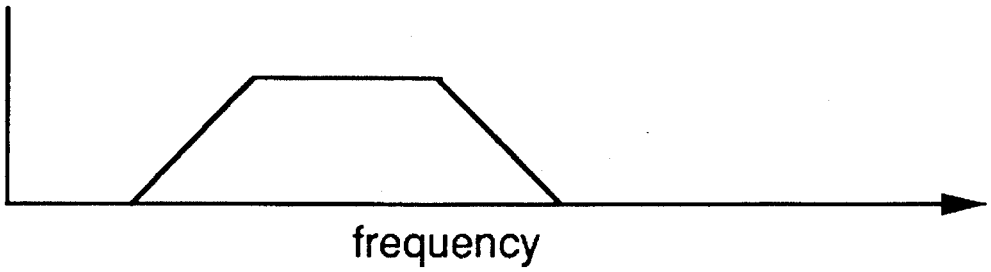

As stated above, a low-pass filter comprising a pair of serially connected 1/C reduce-size and C expand-size X,Y resamplers has a cutoff frequency which is substantially inversely proportional to the value of the factor C. In FIG. 5, the relative value of the factor $C_1$ is small with respect to the value of the factor $C_2$. FIG. 5b shows the relatively high cutoff-frequency spatial spectra of the minuend input to subtraction means 506 with respect to the input-image spatial spectra of FIG. 5a, and FIG. 5c shows the relatively low cutoff-frequency spatial spectra of the subtrahend input to subtraction means 506 with respect to the input-image spatial spectra of FIG. 5a. Therefore, as shown in FIG. 5d, the output-image spatial spectra derived at the output of subtraction means 506, (which is the difference between the FIGS. 5b and 5c spatial spectra) constitutes a band-pass filter output.

Figure 6A:
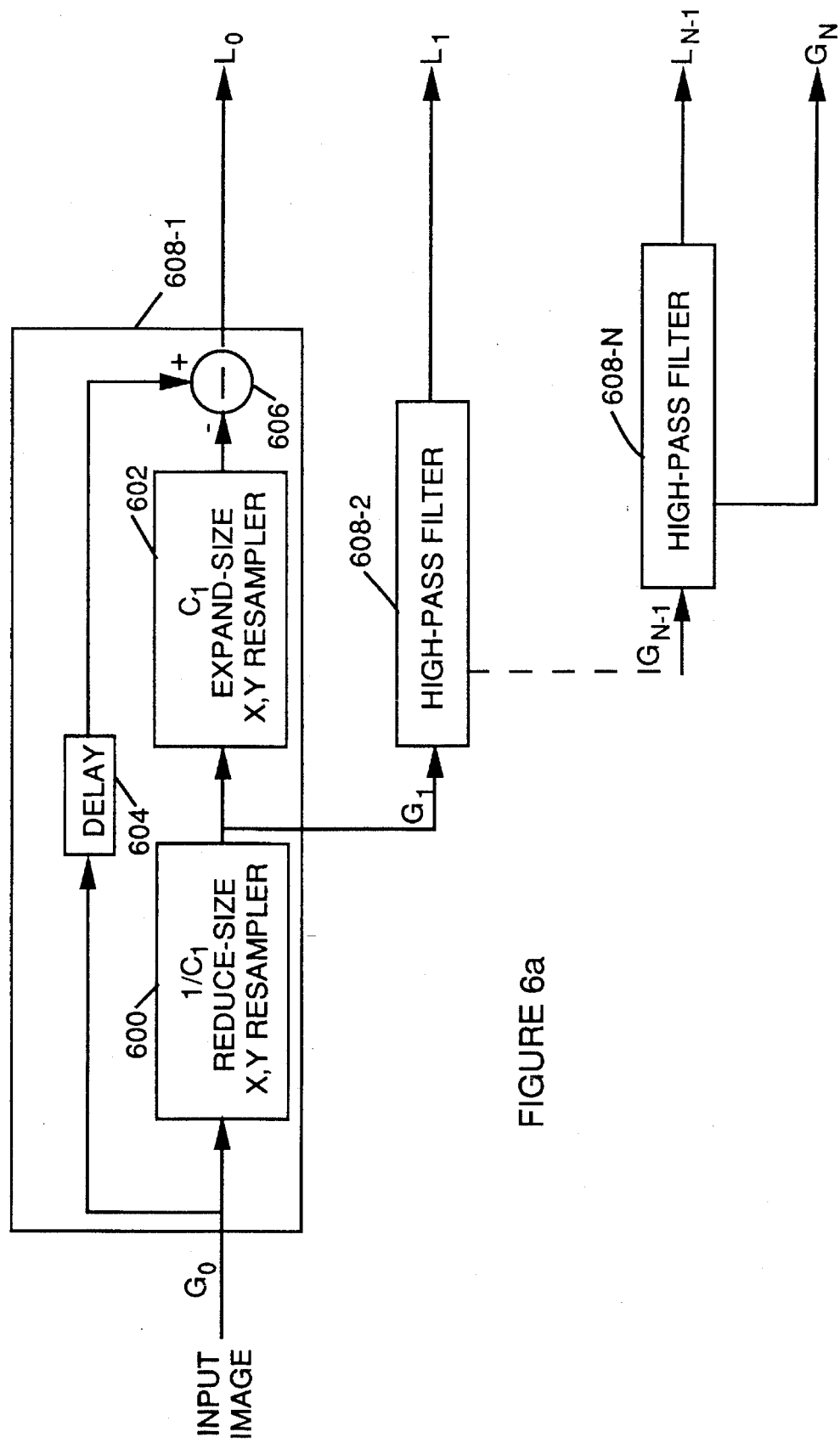
FIGS. 6a and 6b, respectively, illustrate the analyzer and the synthesizer of a hierarchical pyramid that constitutes a fourth embodiment of the present invention.
Figure 6B:
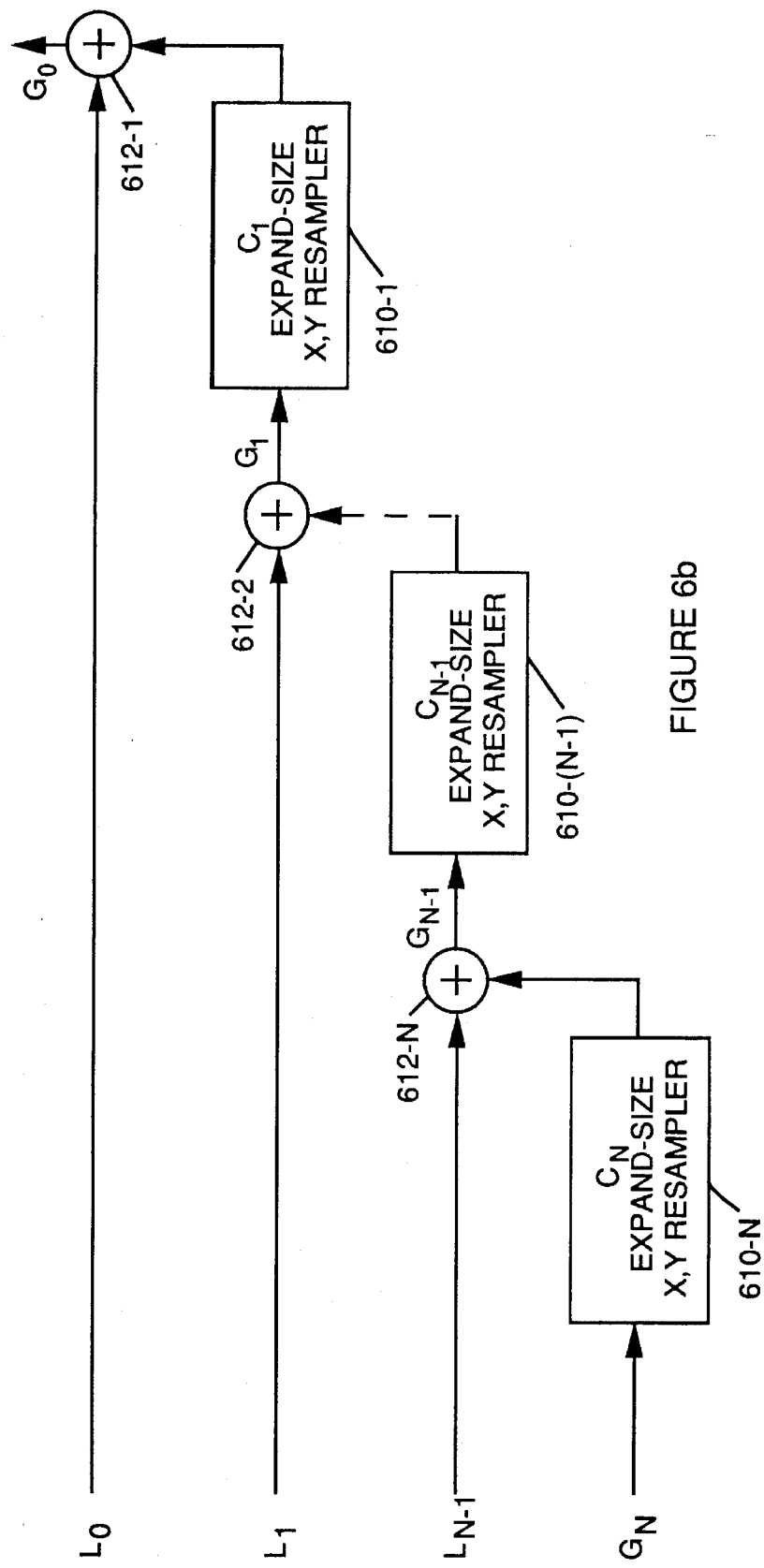

Referring now to FIGS. 6a and 6b, there is shown a hierarchical pyramid that constitutes a fourth embodiment of the present invention. Specifically, FIG. 6a shows the analyzer of the hierarchical pyramid of the present invention, which is a modification of the prior-art Laplacian pyramid analyzer disclosed in the aforesaid U.S. Pat. No. 4,674,125, and FIG. 6b shows the synthesizer of the hierarchical pyramid of the present invention, which is a modification of the prior-art Laplacian pyramid synthesizer disclosed in the aforesaid U.S. Pat. No. 4,674,125.

The analyzer of FIG. 6a, like the prior-art Laplacian pyramid analyzer, comprises a hierarchical pyramid of high-pass filter stages 608-1, 608-2 . . . 608-N for deriving a group of Laplacian outputs $L_0, L_1, \ldots L_{N-1}$ and Gaussian remnant $G_N$ in response to successive digital samples of a Gaussian high-resolution input image $G_O$ applied as an input to stage 608-1. As exemplified by stage 608-1, the high-pass filters of each of stages 608-1, 608-8 . . . 608-N comprises reduce-size and expand-size resamplers 600 and 602, delay means 604, and subtraction means 606 that are structurally and functionally interconnected and operate in the manner described above in connection with FIG. 4. Further, as indicated in FIG. 6a, the respective reduce-size resamplers of stages 608-1, 608-8 . . . 608-N derive lower resolution Gaussian images than the input image to that stage. Thus, reduce-size resampler 600 of stage 608-1 derives Gaussian image $G_1$, which is applied as an input image to stage 600-2; . . . the reduce-size resampler of stage 608-(N-1), not shown, derives Gaussian image $G_{N-1}$, which is applied as an input image to stage 600-N; and the reduce-size resampler of stage 608-N derives Gaussian remnant image $G_N$.

In prior-art Laplacian pyramidal processing, the analyzer decomposes the horizontal (X) and the vertical (Y) spatial spectra of the input image into multiple, octave-wide, spatial-frequency bands; wherein the frequency decomposition inherently produces bands of information containing one octave of frequency, where adjacent bands touch on octave boundaries. This limitation results from integer subsampling by two in each dimension at each prior-art pyramid analyzer stage.

The present invention avoids this limitation by implementing each of the dimensions of the reduce-size X, Y resampler of each stage of the FIG. 6a hierarchical pyramid in the form shown in FIG. 1 (with n having the positive value +n), implementing each of the dimensions of the expand-size X, Y resampler of each of these stages in the form shown in FIG. 1 (with n having the negative value −n) or in the form shown in FIG. 2, and limiting the value of the factor C employed in each of these stages to an improper fraction having a lowest-common-denominator larger than one. This means that the value of the factor C selected for each of the resamplers of these stages (such as the value $C_1$ selected for reduce-size resampler 600 and expand-size resampler 602 of stage 600-1) may be different from one another. In fact, the selected values for each of the improper fractions $M_{Rx}/L_{Rx}$ and $M_{Ry}/L_{Ry}$ (discussed above) of each stage may all be different from one another. Thus, the spatial-frequency filtering capabilities of the hierarchical pyramid analyzer of the present invention are greatly increased with respect to prior-art pyramid analyzers which are limited to octave-wide, spatial-frequency bands.

FIG. 6b shows a hierarchical pyramid synthesizer that differs from the Laplacian pyramid synthesizer disclosed in the aforesaid U.S. Pat. No. 4,674,125 in the same manner as described above for the pyramid analyzer. More specifically, the remnant Gaussian spatial spectra $G_N$ and the respective Laplacian spatial spectra $L_{N-1}, \ldots L_1$ and $L_0$ are combined by the respective X,Y expand-size resamplers 610-N, 610-(N-1) . . . and 610-1, and summers 612-N, . . . 612-2 and 612-1, which are interconnected as shown in FIG. 6b. In FIG. 6b, the value of each of factors $C_1$ through $C_N$ of resampler stages 610-1 through 610-N are normally selected to be the same as the value of each of factors $C_1$ through $C_N$ of the resamplers of the corresponding high-pass filter stages of the hierarchical pyramid analyzer shown in FIG. 6a. In this case, the reconstructed image at the output from summer 612-1 is substantially identical to the high-resolution input image to the hierarchical pyramid analyzer shown in FIG. 6a.

The present invention, which is particularly suitable for providing interactive, variable-bandwidth low-pass, high-pass, band-pass or hierarchical-pyramid filtering of a signal defining a 2-dimensional image through user control of the resizing parameters, is also suitable for filtering a signal defining 1-dimensional information or multi-dimensional information defined by more than 2 dimensions. Thus, the invention offers a fractionally-scalable bandwidth filter mechanism for information defined by one or more dimensions.

By way of examples, the present invention is beneficial for each of the following purposes:

Medical Image Enhancement

Radiographs contain far more dynamic range than is observable by the human eye at any particular level of illumination. In order to perceive features of interest, such as fractures and micro calcifications, it is desirable to highlight and/or remove detracting surrounding information from the image. The variable-bandwidth filter of the present invention can assist radiologists in detection of such features. For example, by controlling a "track ball" which changes the resize parameters, the filter cutoff can be interactively varied as the radiologist looks for features.

Variable Image Transmission

As video and image picture transmission over narrow band channels becomes more widespread, the need exists for changing the size of the picture at the transmitting end to match that needed by the compression system, as well as reversing the process at the receiving end. Since the source material to be transmitted can come from different resolution systems, i.e. NTSC video, VGA images, SVGA images, high-definition pictures, etc., a general-purpose, fractional, resizing system is needed.

By applying the variable-bandwidth filter of the present invention, images can 1) be scaled appropriately for compression and transmission, and 2) be sent in a progressive format, where component frequency bands of the image are sent as a function of available channel capacity. Unlike other progressive transmission schemes, where the frequency bands are forced to be one octave wide and adjacent bands are located on one-octave boundaries, this new method allows the bands to contain more or less information than one octave's worth, and also to be positioned on non-octave boundaries. This allows for system adaptation of required bandwidth to channel availability in a highly optimized manner.

Frame/Field Rate Conversion

The present invention is suitable for matching one temporal frame or field rate to another, such as 60 fps to 50 fps, a fractional change is needed, i.e. $50/60$. This change can easily be accomplished with the invention described here, where temporal information is scaled as opposed to spatial information. Thus, this method lends itself to 3-dimensional processing as well.

What is claimed is:

1. In filtering apparatus responsive to a sequence of samples of an input signal that is digitally-sampled at a given frequency, wherein said input signal defines information having at least one dimension, and wherein said apparatus comprises first means for resampling said input-signal to derive a first signal at a first frequency which is substantially equal to said given frequency times the reciprocal 1/C of a given factor C, and second means for resampling said first signal to derive a second signal at a second frequency which is substantially equal to said first frequency times said given factor C; the improvement wherein:

said given factor C is an improper fraction having a least-common-denominator larger than one;

whereby said first means and second means in combination comprise a low-pass filter having a relative cutoff frequency with respect to said given frequency determined by the value of said given factor C.

2. The filtering apparatus defined in claim 1, wherein said input signal defines information having a first dimension X that is digitally-sampled at one given frequency and a second dimension Y that is digitally-sampled at another given frequency, and wherein:

said first means includes third means for resampling said first dimension X of said input signal to derive an X-dimension component of said first signal at a frequency which is substantially equal to said the frequency times the reciprocal 1/x of a given factor x, and fourth means for resampling said second dimension Y of said input-signal to derive a Y-dimension component of said first signal at a frequency which is substantially equal to said other given frequency times the reciprocal 1/y of a given factor y;

said second means includes fifth means for resampling said X-dimension component of said first signal at a frequency which is substantially equal to said frequency of said X-dimension component times said given factor x, and sixth means for resampling said Y-dimension component of said first signal at a frequency which is substantially equal to said frequency of said Y-dimension component times said given factor y; and the product of x times y is equal to C.

3. The filtering apparatus defined in claim 2, wherein:

said input signal is a digitally-sampled scanned video signal defining two-dimensional image information having a first given number of pixels per scanline in said-X dimension of said image and a second given number of scanlines in said Y dimension of said image.

4. The filtering apparatus defined in claim 1, wherein said first and second means introduce a certain delay between corresponding samples of said second signal and said input signal, and wherein said filtering apparatus further comprises:

delay means for delaying each digital sample of said input signal by said certain delay; and subtraction means for subtracting the digital value of each sample of said second signal from the corresponding delayed sample of said input signal for deriving an output signal having a digital value substantially equal to the difference between the digital values of said corresponding delayed input-signal samples and samples of said second signal;

whereby said first means, second means, delay means and subtraction means in combination comprise a high-pass filter having a relative cutoff frequency with respect to said given frequency determined by the value of said given factor C.

5. The filtering apparatus defined in claim 1, wherein said given factor C has a first given value $C_1$, and said filtering apparatus further comprises:

third means for resampling said input-signal to derive a third signal at a third frequency which is substantially equal to said given frequency times the reciprocal $1/C_2$ of a factor having a second given value $C_2$ which is is an improper fraction having a least-common-denominator larger than one, said second given value $C_2$ being smaller than said first given value $C_1$;

fourth means for resampling said third signal to derive a fourth signal at a fourth frequency which is substantially equal to said third frequency times said factor having said second given value $C_2$; and subtraction means for subtracting the digital value of each sample of said fourth signal from the corresponding sample of said third signal for deriving an output signal having a digital value substantially equal to the difference between the digital values of said corresponding third-signal samples and samples of said fourth signal;

whereby said first means, second means, third means, fourth means and subtraction means in combination comprise a band-pass filter having a relative upper cutoff frequency with respect to said given frequency determined by said first given value $C_1$ and having a relative lower cutoff frequency with respect to said given frequency determined by said second given value $C_2$.

6. The filtering apparatus defined in claim 1, wherein said apparatus comprises a hierarchical pyramid analyzer having N stages, where N is a given plural number; and wherein:

each of said N stages comprising a high-pass filter including said first means, said second means, delay means and subtraction means;

means for applying said first signal of each stage preceding said Nth stage of said N stages as an input signal to its immediately succeeding stage, and applying an external input signal as the input signal to the first of said N stages;

said delay means of each of said N stages delaying each digital sample of the input signal to that stage by a delay that corresponds to the delay introduced by said first and second means of that stage; and said subtraction means of each of said N stages subtracting the digital value of each sample of said second signal derived from that stage from the corresponding delayed sample of said input signal to that stage for deriving a Laplacian output signal from that stage of said pyramid analyzer that is substantially equal to the difference between the digital values of said corresponding delayed input-signal samples and samples of said second signal of that stage; and said first signal of said Nth stage constituting a remnant output signal of said pyramid analyzer.

7. The filtering apparatus defined in claim 6, wherein said given factor C of said first means and said second means of said high-pass filter of each of said N stages has a selected given value of said improper fraction corresponding therewith which is independent of the selected given value of said improper fraction corresponding with said first means and said second means of said high-pass filter of any other of said N stages.

8. In a hierarchical pyramid analyzer responsive to a sequence of samples of an original signal digitally-sampled at a given frequency, wherein said original signal defines information having at least one dimension, said analyzer comprising N ordinally-arranged high-pass filter stages 1 . . . N, which include resampling means, where N is a given plural number, for deriving a group of N+1 ordinally-arranged digitally-sampled signals, comprising N Laplacian signals $L_0 \ldots L_{(N-1)}$ and a Gaussian remnant signal $G_N$ in which the sampling frequency of each ordinal one of said group of signals $L_1 \ldots L_{(N-1)}, G_N$ is lower than the sampling frequency of the signal of said group that immediately precedes that ordinal one of said group by the reciprocal 1/C of a factor C having a value that corresponds with that ordinal one of said group of signals; the improvement wherein:

in at least one of said N stages, the factor C has a value which is an improper fraction having a lowest-common-denominator larger than one.

9. The pyramid analyzer defined in claim 8, wherein:

in each of said N stages, the factor C has a value which is an improper fraction having a lowest-common-denominator larger than one.

10. The pyramid analyzer defined in claim 8, wherein:

in one of said N stages, the factor C has a first given value which is an improper fraction having a lowest-common-denominator larger than one; and in another of said N stages, the factor C has a second given value which is an improper fraction having a lowest-common-denominator larger than one which is different from said first given value.

11. In a hierarchical pyramid synthesizer comprising N ordinally-arranged stages 1 . . . N, where N is a given plural number, for deriving a reconstituted digitally-sampled signal of an original digitally-sampled signal from a group of N+1 ordinally-arranged digitally-sampled signals, comprising N Laplacian signals $L_0 \ldots L_{(N-1)}$ and a Gaussian remnant signal $G_N$, derived from a hierarchical pyramid analyzer of said original digitally-sampled signal, wherein the digital sampling frequency of each ordinal one of said group of signals $L_1 \ldots L_{(N-1)}, G_N$ is lower than the sampling frequency of the signal of said group that immediately precedes that ordinal one of said group by the reciprocal 1/C of a factor C having a value that corresponds with that ordinal one of said group of signals; wherein each of stages 1 . . . N includes resampler means for increasing the frequency of an input signal applied to that ordinal stage by the same factor C as that having a value that corresponds with that ordinal one of said group of signals; the improvement wherein:

in at least one of said N stages, the factor C has a value which is an improper fraction having a lowest-common-denominator larger than one.

12. The pyramid synthesizer defined in claim 11, wherein:

in each of said N stages, the factor C has a value which is an improper fraction having a lowest-common-denominator larger than one.

13. The pyramid synthesizer defined in claim 11, wherein:

in one of said N stages, the factor C has a first given value which is an improper fraction having a lowest-common-denominator larger than one; and in another of said N stages, the factor C has a second given value which is an improper fraction having a lowest-common-denominator larger than one which is different from said first given value.

\* \* \* \* \*